(12) United States Patent
Akahori et al.

(10) Patent No.: US 7,163,644 B2
(45) Date of Patent: *Jan. 16, 2007

(54) CMP ABRASIVE, LIQUID ADDITIVE FOR CMP ABRASIVE AND METHOD FOR POLISHING SUBSTRATE

(75) Inventors: Toshihiko Akahori, Shimodate (JP); Toranosuke Ashizawa, Hitachi (JP); Keizo Hirai, Hitachi (JP); Miho Kurihara, Hitachi (JP); Masato Yoshida, Tsukuba (JP); Yasushi Kurata, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 132 days.

This patent is subject to a terminal disclaimer.

(21) Appl. No.: 10/990,427

(22) Filed: Nov. 18, 2004

(65) Prior Publication Data
US 2005/0118820 A1    Jun. 2, 2005

Related U.S. Application Data

(60) Continuation of application No. 10/759,163, filed on Jan. 20, 2004, now abandoned, which is a division of application No. 09/856,491, filed on Jun. 19, 2001, now Pat. No. 6,783,434.

(30) Foreign Application Priority Data

Dec. 25, 1998   (JP) ............................... 10-368355

(51) Int. Cl.
C09K 13/00    (2006.01)

(52) U.S. Cl. .................. 252/79.1; 216/89; 451/141; 51/309; 438/692

(58) Field of Classification Search .............. None
See application file for complete search history.

(56) References Cited

U.S. PATENT DOCUMENTS 5,759,917 A    6/1998   Grover et al. ............. 438/690
6,176,763 B1   1/2001   Kramer et al. ............. 451/41
6,221,118 B1   4/2001   Yoshida et al. ............ 51/309
6,319,095 B1   11/2001  Merchant et al. .......... 451/36
6,478,836 B1   11/2002  Kido et al. ............... 51/309
6,774,041 B1*  8/2004   Kondo et al. ............. 438/692
2002/0086618 A1* 7/2002 Ota et al. .................. 451/41

FOREIGN PATENT DOCUMENTS

| JP | 61-96660    | 6/1986  |
| JP | 02-156530   | 6/1990  |
| JP | 10-152673   | 6/1998  |
| JP | 10-152673 A | 6/1998  |
| JP | 10-298537 A | 11/1998 |

* cited by examiner

Primary Examiner—Nadine G. Norton
Assistant Examiner—Patricia A. George
(74) Attorney, Agent, or Firm—Westerman, Hattori, Daniels & Adrian, LLP.

(57) ABSTRACT

A CMP abrasive comprising a cerium oxide slurry containing cerium oxide particles, a dispersant and water, and a liquid additive containing a dispersant and water; and a liquid additive for the CMP abrasive. A method for polishing a substrate which comprises holding a substrate having, formed thereon, a film to be polished against a polishing pad of a polishing platen, followed by pressing, and moving the substrate and the polishing platen while supplying the above CMP abrasive in between the film to be polished and the polishing pad to thereby polish the film to be polished. The CMP abrasive and the method for polishing can be used for polishing a surface to be polished such as a silicone oxide film or a silicon nitride film without contaminating the surface to be polished with an alkali metal such as sodium ions and with no flaws, and the CMP abrasive is excellent in storage stability.

9 Claims, No Drawings

CMP ABRASIVE, LIQUID ADDITIVE FOR CMP ABRASIVE AND METHOD FOR POLISHING SUBSTRATE

This application is a continuation of U.S. patent application Ser. No. 10/759,163, filed on Jan. 20, 2004, now abandoned, which is a divisional of U.S. patent application Ser. No. 09/856,491, filed on Jun. 19, 2001, now U.S. Pat. No. 6,783,434.

TECHNICAL FIELD

The invention relates to a CMP abrasive usable in the production of semiconductor elements, a liquid additive for CMP abrasive and a method for polishing substrates. Particularly, it relates to a CMP abrasive usable in the step of planarizing the surface of a substrate, typically the steps of planarizing an interlayer insulating film and forming shallow-trench separation, to a liquid additive for the CMP abrasive and to a method for polishing substrates by using the CMP abrasive.

BACKGROUND ART

In present ultra large scale integrated circuits, packaging density is increasing, and various fine processing techniques have been studied and developed. Design rules have already reached the order of sub half micron. CMP (Chemical Mechanical Polishing) is one of the techniques developed to satisfy such a strict requirement for fineness. This technique is essential for the production of semiconductor devices, typically for planarizing interlayer insulating films and for shallow-trench separation, because it can completely planarize layers to be exposed, reducing the burden on exposure techniques and stabilizing the production yield.

Colloidal silica abrasives have been investigated as common CMP abrasives to be used in the production of semiconductor devices to planarize inorganic insulating films, such as silicon oxide insulating film, formed by using silica particles, which are typically formed from tetrachlorosilane through thermal decomposition, and adjusting pH. Such abrasives, however, cannot polish inorganic insulating films fast enough, and need higher polishing rate for their practical use.

In integrated circuits with design rules of 0.5 μm or more, devices were separated by LOCOS (Localized Oxidation of Silicon). As the processing measurements have become finer, shallow-trench separation has become used in response to the requirement for a technique giving narrower separation gap between devices. For shallow-trench separation, the surplus parts of a silicon oxide film formed on a substrate are removed by CMP, and a stopper film reducing the polishing rate is provided under the silicon oxide film to stop polishing. The stopper film is typically made of silicon nitride, and the rates of polishing the silicon oxide film and the stopper film are preferably in a large ratio. Where conventional colloidal silica abrasives are used, the ratio between the rate of polishing the silicon oxide film and the rate of polishing the stopper film is as small as the order of 3, and such abrasives cannot satisfy the requirements of practical shallow-trench separation.

On the other hand, cerium oxide abrasives have been used for polishing photo masks or the surface of glass, such as lenses. Having lower hardness as compared to silica particles and alumina particles, cerium oxide particles hardly make flaws on the polished surface and are suitable for finish mirror polishing. However, the cerium oxide abrasives for polishing glass surfaces cannot be used as abrasives for polishing semiconductors, because they contain a dispersant containing sodium salts.

DISCLOSURE OF INVENTION

An object of the invention is to provide a CMP abrasive, which can speedily polish a surface to be polished, such as a silicon oxide insulating film, without making flaws.

Another object of the invention is to provide a CMP abrasive, which can speedily polish a surface to be polished, such as a silicon oxide insulating film, without contaminating the surface to be polished with alkali metals, such as sodium ions, nor making flaws.

Another object of the invention is to provide a CMP abrasive, which is more advantageous in that it can increase the ratio of the rate of polishing a silicon oxide insulating film to the rate of polishing a silicon nitride insulating film.

Another object of the invention is to provide a CMP abrasive, which can speedily polish a surface to be polished, such as a silicon oxide insulating film, without contaminating the surface to be polished with alkali metals, such as sodium ions nor making flaws and contains a cerium oxide slurry improved in storage stability.

Another object of the invention is to provide a CMP abrasive, which can speedily polish a surface to be polished, such as a silicon oxide insulating film, without contaminating the surface to be polished with alkali metals, such as sodium ions, nor making flaws, and can increase the ratio of the rate of polishing a silicon oxide insulating film to the rate of polishing a silicon nitride insulating film to 50 or more.

Another object of the invention is to provide a liquid additive, which is to be used to give a CMP abrasive improved in storage stability.

Another object of the invention is to provide a liquid additive for CMP abrasive to be used to improve the flatness of the polished surface of a substrate.

Another object of the invention is to provide a method for polishing a substrate, which can polish a surface of the substrate without making flaws on its polished surface.

Another object of the invention is to provide a method for polishing a substrate, which can speedily polish a surface to be polished, such as a silicon oxide insulating film, without making flaws, and can increase the ratio of the rate of polishing a silicon oxide insulating film to the rate of polishing a silicon nitride insulating film to 50 or more.

Accordingly, the invention relates to:

(1) a CMP abrasive comprising a cerium oxide slurry containing cerium oxide particles, a dispersant and water; and a liquid additive containing a dispersant and water;

(2) the CMP abrasive of (1), wherein each of the dispersants contained in the cerium oxide slurry and the liquid additive respectively is a polymer dispersant, which is a polymer containing ammonium acrylate as a copolymerized ingredient;

(3) the CMP abrasive of (1), wherein each of the dispersants contained in the cerium oxide slurry and the liquid additive respectively is a polymer dispersant, which is a polyammonium-acrylate or a polyamine-acrylate;

(4) the CMP abrasive of (2) or (3), wherein the polymer dispersants have a weight average molecular weight of 100 to 50,000;

(5) the CMP abrasive of (1), wherein the cerium oxide slurry contains 0.01 to 2.0 parts by weight of the dispersant relative to 100 parts by weight of the cerium oxide particles and contains 0.3 to 40% by weight of the cerium oxide particles based on the cerium oxide slurry;

(6) the CMP abrasive of any one of (1) to (5), wherein the cerium oxide slurry is pH 6 to 10;

(7) the CMP abrasive of any one of (1) to (6), which is 50 or more in ratio of rate of polishing a silicon oxide film to rate of polishing a silicon nitride film (8) a liquid additive for CMP abrasive comprising a dispersant and water;

(9) the liquid additive for CMP abrasive of (8), which contains 1 to 10% by weight of the dispersant;

(10) the liquid additive for CMP abrasive of (9), wherein the dispersant is a polyammonium-acrylate or a polyamine-acrylate;

(11) the liquid additive for CMP abrasive of (10), wherein the polyammonium-acrylate or the polyamine-acrylate has a weight average molecular weight of 1,000 to 100,000;

(12) the liquid additive for CMP abrasive of (11), wherein the polyammonium-acrylate or the polyamine-acrylate has a molecular weight distribution (weight average molecular weight/number average molecular weight) of 1.005 to 1.300;

(13) the liquid additive for CMP abrasive of (10), wherein the polyammonium-acrylate or the polyamine-acrylate contains 10 mol % or less of free ammonia or a free amine, which does not form a salt;

(14) the liquid additive for CMP abrasive of (10) which is pH 4 to 8;

(15) the liquid additive for CMP abrasive of (10), which has a viscosity of 1.20 to 2.50 mPa·s;

(16) a method for polishing a substrate, comprising holding a substrate having, formed thereon, a film to be polished against a polishing pad of a polishing platen, followed by pressing, and moving the substrate and the polishing platen while supplying the CMP abrasive of any one of (1) to (7) in between the film to be polished and the polishing pad to thereby polish the film to be polished; and

(17) the method of (16), wherein the substrate to be polished has-at least a silicon oxide film or a silicon nitride film formed thereon.

BEST MODE FOR CARRYING OUT THE INVENTION

Cerium oxide may be produced by the oxidation of a cerium compound, such as carbonate, nitrate, sulfate or oxalate of cerium. Conventional cerium oxide abrasives for polishing silicon oxide films formed by TEOS-CVD or the like contain monocrystalline cerium oxide particles with large primary particle sizes, and tend to make polishing flaws. Therefore, the cerium oxide particles to be used in the invention are not limited in the method of production, but are preferably polycrystals that are aggregates of monocrystals of 5 nm to 300 nm. For polishing semiconductor chips, the cerium oxide particles preferably contain as little as 10 ppm or less of alkali metals and halogens.

The methods usable in the invention to produce the cerium oxide particles include burning or oxidation using hydrogen peroxide or the like. Preferred burning temperatures range from 350 to 900° C. The raw material suitable for the method is cerium carbonate.

The above method gives aggregates of cerium oxide particles, which are then preferably pulverized mechanically. Examples of preferred pulverizing methods include dry grinding using a jet mill, and wet grinding using a planetary bead mill.

The cerium oxide slurry to be used in the invention is obtainable, for example, by dispersing a composition comprising the cerium oxide particles having the above characteristics, a dispersant for dispersing the cerium oxide particles in water and water. The content of the cerium oxide particles is not limited but is preferably 0.3 to 40% by weight, more preferably 0.5 to 20% by weight to handle the dispersion easily. In the CMP abrasive obtainable by mixing the cerium oxide slurry and a liquid additive, the content of the cerium oxide particles is preferably 0.01 to 10% by weight, more preferably 0.1 to 5% by weight.

The dispersant to be used in the invention comprises one or two compounds selected from polymer dispersants, water-soluble anionic surfactants, water-soluble nonionic surfactants, water-soluble cationic surfactants and water-soluble amphoteric surfactants. For polishing semiconductor chips, the dispersant preferably contains as little as 10 ppm or less of alkali metals, such as sodium ions and potassium ions, halogens and sulfur.

Examples of polymer dispersants include polymers of unsaturated carboxylic acids, such as acrylic acid, methacrylic acid or maleic acid, or ammonium salts or amine salts of the polymers; copolymers of an unsaturated carboxylic acid, such as acrylic acid, methacrylic acid or maleic acid, with a copolymerizable monomer, for example, an alkyl acrylate, such as methyl acrylate or ethyl acrylate, a hydroxyalkyl acrylate, such as hydroxyethyl acrylate, an alkyl methacrylate, such as methyl methacrylate or ethyl methacrylate, a hydroxyalkyl methacrylate, such as hydroxyethyl methacrylate, vinyl acetate or vinyl alcohol, and ammonium salts or amine salts of the copolymers. The unsaturated carboxylic acid moieties in the polymers or copolymers may be converted into ammonium salts either before or after polymerization. The polymers and copolymers preferably contain 1 to 100 mol %, more preferably 10 to 100 mol % of unsaturated carboxylic acid moieties.

Preferred dispersants are polymers containing ammonium acrylate as a copolymerized ingredient, polyammonium-acrylates and polyamine-acrylates. Polyammonium-acrylates and polyamine-acrylates preferably have weight average molecular weights of 1,000 to 100,000, more preferably 3,000 to 60,000, further preferably 10,000 to 40,000. If the weight average molecular weight is less than 1,000, cerium oxide particles may aggregate, and if more than 100,000, polishing rate ratio may be reduced. The polyammonium-acrylates and polyamine-acrylates preferably have molecular weight distributions (weight average molecular weight/number average molecular weight) of 1.005 to 1.300, more preferably 1.100 to 1.250, further preferably 1.150 to 1.200. If the molecular weight distribution is less than 1.005, the cerium oxide particles may aggregate, and if more than 1.300, the polishing rate ratio may be reduced. Herein, the weight average molecular weight and number average molecular weight are measured through gel permeation chromatography, based on the calibration curve of a standard, polystyrene.

The polyammonium-acrylates and polyamine-acrylates are obtainable through neutralization of a mixture comprising a polyacrylic acid and an equimolar amount of ammonia or an amine relative to carboxyl groups, and, in view of high flatness, preferably contain as little as 10 mol % or less of free ammonia or amine forming no salts (that is, at least 90 mol % of the carboxyl groups of polyacrylic acid are preferably neutralized). The amount of the free ammonia or amine forming no salts can be determined by adding an organic solvent to precipitate the polymer, filtering the polymer and quantitatively determining the amount of ammonia or amine in the filtrate.

Examples of water-soluble anionic surfactants include triethanolamine lauryl sulfate, ammonium lauryl sulfate and triethanolamine polyoxyethylene alkyl ether sulfates.

Examples of water-soluble nonionic surfactants include polyoxyethylene lauryl ether, polyoxyethylene cetyl ether, polyoxyethylene stearyl ether, polyoxyethylene oleyl ether, polyoxyethylene higher alcohol ethers, polyoxyethylene octyl phenyl ether, polyoxyethylene nonyl phenyl ether, polyoxyalkylene alkyl ethers, polyoxyethylene derivatives, polyoxyethylenesorbitan monolaurate, polyoxyethylenesolbitan monoparmitate, polyoxyethylenesolbitan monostearate, plyoxyethylenesolbitan tristearate, polyoxyethylenesolbitan monooleate, polyoxyethylenesolbitan trioleate, polyoxyethylenesolbitol tetraoleate, polyethylene glycol monolaurate, polyethylene glycol monostearate, polyethylene glycol distearate, polyethylene glycol monooleate, polyoxyethylene alkyl amines, polyoxyethylene hardened castor oil and alkylalkanolamides. Examples of water-soluble cationic surfactants include coconutamine acetate and stearylamine acetate.

Examples of water-soluble amphoteric surfactants include laurylbetaine, stearylbetaine, lauryldimethylamine oxide and 2-alkyl-N-carboxymethyl-N-hydroxyethylimidazoliniumbetaine.

In view of the dispersibility of particles in the cerium oxide slurry, the prevention of their sedimentation and the relationship between polishing flaws and the amount of the dispersants added, the amount of the dispersant added in the cerium oxide slurry is preferably 0.01 to 2.0 parts by weight relative to 100 parts by weight of cerium oxide particles.

Among the dispersants described above, the polymer dispersants preferably have weight average molecular weights of 100 to 100,000, more preferably 100 to 50,000, further preferably 1,000 to 10,000, as measured through gel permeation chromatography based on the calibration curve of the standard, polystyrene. If the molecular weight of the dispersant is too low, silicon oxide films or silicon nitride films may not be polished speedily enough, and if it is too high, the cerium oxide slurry may be too viscous and lose storage stability.

The pH of the cerium oxide slurry is preferably 6 to 10. If the pH is too low, a liquid mixture of the cerium oxide slurry and a liquid additive may lose storage stability and make polishing flaws on polished silicon oxide or silicon nitride films, and if the pH is too high, a liquid mixture of the cerium oxide slurry and a liquid additive may also lose storage stability and make polishing flaws on polished silicon oxide or silicon nitride films. The pH may be adjusted by adding an aqueous ammonia and stirring.

The cerium oxide particles can be dispersed in water by using a common stirrer or others, such as a homogenizer, an ultrasonic disperser or a wet ball mill.

The oxide particles in the slurry thus produced preferably have an average particle size of 0.01 to 1.0 μm. This is because cerium oxide particles with a too small average particle size have a considerably low polishing rate, and that with a too large average particle size tends to make flaws on the polished film.

The liquid additive for CMP abrasive of the invention comprises a dispersant and water. The dispersant is for dispersing the cerium oxide particles contained in the above-described cerium oxide slurry in water. In view of the polishing rate ratio and the high flatness of the polished surface, the dispersants suitable for the cerium oxide slurry are also suitable for the liquid additive. The dispersants used in the cerium oxide slurry and the liquid additive may be identical with or different from each other. The concentration of the dispersant in the liquid additive is preferably 1 to 10% by weight. If it is less than 1% by weight, the polished surface may be less flat, and if more than 10% by weight, the cerium oxide particles may aggregate.

The CMP abrasive of the invention is used so that the cerium oxide slurry and the liquid additive prepared apart from each other are mixed at the time of polishing. If the cerium oxide slurry and the liquid additive are stored in a form of a mixture, the cerium oxide particles will aggregate, thereby making polishing flaws and causing a change in polishing rate. Therefore, the liquid additive and the cerium oxide slurry are supplied on a polishing platen separately and mixed thereon, or mixed immediately before polishing and then supplied onto a polishing platen. The mixing ratio between the cerium oxide slurry and the liquid additive is not particularly limited so far as the desired concentrations are finally given.

In view of the dispersibility of particles in the slurry, the prevention of their sedimentation and the relationship between polishing flaws and the amount of the dispersant added, the amount of the dispersant in the liquid additive relative to the cerium oxide is preferably 0.001 to 2000 parts by weight, more preferably 0.01 to 1000 parts by weight, further preferably 0.01 to 500 parts by weight, relative to 100 parts by weight of the cerium oxide particles in the cerium oxide slurry.

The specific gravity of the liquid additive is preferably 1.005 to 1.050, more preferably 1.007 to 1.040, further preferably 1.010 to 1.030. If the specific gravity is less than 1.005, the polished surface may be less flat, and if more than 1.050, the cerium oxide particles may aggregate. The pH of the liquid additive is preferably 4 to 8, more preferably 5 to 7, further preferably 6 to 7. If the pH is less than 4, the polishing rate may be reduced, and if more than 8, the polished surface may be less flat. The adjustment of pH may be performed by adding an acid or an alkali, such as acetic acid or aqueous ammonia, to the liquid additive. The viscosity of the liquid additive at 25° C. is preferably 1.20 to 2.50 mPa·s, more preferably 1.30 to 2.30 mPa·s, further preferably 1.40 to 2.20 mPa·s. If the viscosity is less than 1.20 mPa·s, the cerium oxide particles may aggregate, and if more than 2.50 mPa·s, the polished surface may be less flat.

In the CMP abrasive of the invention, the cerium oxide slurry and the liquid additive may be used as they are, or non-polymeric additives, such as N,N-diethylethanolamine, N,N-dimethylethanolamine or aminoethylethanolamine, may be added to the cerium oxide slurry or the liquid additive for CMP. The amounts of such additives are such that their total concentration in the resulting CMP abrasive is preferably 0.001 to 20% by weight, more preferably 0.01 to 10% by weight.

The inorganic insulating film for which the CMP abrasive of the invention is used may be formed, for example, by low pressure CVD or plasma CVD. To form a silicon oxide film by low pressure CVD, monosilane: $SiH_4$ is used as an Si-source, and oxygen: $O_2$ as an oxygen-source, and $SiH_4$—$O_2$ oxidation is carried out at a low temperature of 400° C. or lower. After CVD, heat treatment at a temperature not higher than 1000° C. may optionally be carried out. Where phosphorus: P is doped to planarize the surface by high temperature reflow, an $SiH_4$—$O_2$—$PH_3$ reaction gas is preferably used. Plasma CVD is advantageous in that chemical reactions requiring high temperatures under normal, thermal equilibrium can undergo at lower temperatures. The methods for generating plasma include two types of capacitive coupling and inductive coupling. Examples of reaction gases include an $SiH_4$—$N_2O$ gas comprising $SiH_4$ as an Si-source and $N_2O$ as an oxygen-source; and a TEOS-$O_2$ gas containing tetraethoxysilane (TEOS) as an Si-source (TEOS-plasma CVD). The preferred temperature of the substrate ranges from 250 to 400° C., and preferred reaction pressure ranges from 67 to 400 Pa. As described above, the silicon oxide film to be used in the invention may be doped with other elements, such as phosphorus or boron.

To form a silicon nitride film by low pressure CVD, dichlorosilane: $SiH_2Cl_2$ is used as an Si-source, and ammonia: $NH_3$ as a nitrogen-source, and the $SiH_2Cl_2$—$NH_3$ oxidation is carried out at a high temperature of 900° C. An example of the reaction gas for plasma CVD is an $SiH_4$—$NH_3$ gas comprising $SiH_4$ as an Si-source and $NH_3$ as a nitrogen-source. The preferred temperature of the substrate ranges from 300 to 400° C.

The substrate to be used may be a semiconductor substrate bearing circuit devices and wiring patterns formed thereon, or a semiconductor substrate which bears circuit devices formed thereon and is further coated with a silicon oxide film layer or a silicon nitride film layer. Polishing a silicon oxide film layer or a silicon nitride film layer formed on such a semiconductor substrate by using the CMP abrasive smoothes out the unevenness on the surface of the silicon oxide film layer, to planarize whole the surface of the semiconductor substrate. It is also applicable for shallow-trench separation. Shallow-trench separation needs a ratio of the rate of polishing a silicon oxide film to the rate of polishing a silicon nitride film (silicon oxide film-polishing rate/silicon nitride film-polishing rate) of 10 or more. If the ratio is too small, the difference between the silicon oxide film-polishing rate and the silicon nitride film-polishing rate will be too small to stop polishing at a position predetermined for shallow-trench separation. If the ratio is 50 or more, polishing can be stopped easily by the further reduced polishing rate of silicon nitride film, and the CMP abrasive with such a ratio is more suitable for shallow-trench separation.

The polishing apparatus to be used may be a common one, which has a holder for holding a semiconductor substrate and a platen (equipped with a motor or the like capable of changing rotational speed) applied with a polishing pad. The material of the polishing pad may be any one, such as a non-woven fabric, a polyurethane foam or a porous fluorine resin. The polishing pad is preferably grooved to collect the CMP abrasive in the grooves. The polishing conditions are not limited, but the rotational speed of the platen is preferably as low as 200 rpm or less to prevent the semiconductor substrate from being emitted. The pressure applied to the semiconductor substrate is preferably 1 kg/cm$^2$ or less not to make polishing flaws. For shallow-trench separation, polishing should make few flaws. During polishing, the slurry is continuously supplied to the polishing pad by some means, such as a pump. Not limitative but preferred amount of the slurry supplied is such that the surface of the polishing pad is always coated with the slurry.

After polishing, the semiconductor substrate is preferably washed well in running water and then dried after blowing away the water droplets from the semiconductor substrate by a spin drier or the like. Thus a planarized shallow-trench structure is formed. Subsequently, aluminum wiring is formed on the silicon oxide insulating film layer, and a silicon oxide insulating film is again formed between and on the wiring by the same method as described above and polished by using the CMP abrasive to smooth out the unevenness on the insulating film surface, thereby planarizing whole the surface of the semiconductor substrate. The process is repeated to produce a semiconductor with desired layers.

The CMP abrasive of the invention can polish not only the silicon oxide film formed on a semiconductor substrate but also an inorganic insulating film formed on a wiring board bearing a predetermined wiring, such as a silicon oxide film, glass or silicon nitride; optical glass, such as photo masks, lenses and prisms; inorganic conductor films, such as ITO; optical integrated circuits, optical switching devices and optical guides, which are made of glass and crystalline materials; the end faces of optical fibers; optical monocrystals, such as scintillators; solid-state laser monocrystals; sapphire substrates for blue laser LED; semiconductor monocrystals, such as SiC, GaP and GaAS; glass substrates for magnetic discs; and magnetic heads.

Hereinafter, the invention will be described in more detail referring to Examples and Comparative Examples, which however do not limit the scope of the invention.

Preparation 1 (Preparation of Cerium Oxide Particles)

2 kg of cerium carbonate hydrate was placed in a platinum vessel and burned in the air at 700° C. for 2 hours, to give about 1 kg of yellowish white powder. The powder was identified to be cerium oxide by X-ray diffractiometry. The cerium oxide powder was mixed with deionized water to 10% by weight concentration, and pulverized with a horizontal wet ultrafine dispersing-pulverizer at 1400 rpm for 120 minutes. The resulting liquid abrasive was heated to 110° C. for 3 hours to give dry cerium oxide particles. The cerium oxide particles were polycrystals comprising 10 to 60-nm-particle size primary particles as observed by a transmission electron microscope, and had a specific surface area of 39.5 m$^2$/g as measured by the BET method.

Preparation 2 (Preparation of Cerium Oxide Particles)

2 kg of cerium carbonate hydrate was placed in an platinum vessel and burned in the air at 700° C. for 2 hours, to give about 1 kg of yellowish white powder. The powder was identified to be cerium oxide by X-ray diffractiometry. 1 kg of the cerium oxide powder was dry-ground with a jet mill. The cerium oxide particles were polycrystals comprising 10 nm to 60-nm-particle size primary particles as observed by a transmission electron microscope, and had a specific surface area of 41.2 m$^2$/g as measured by the BET method.

Preparation 3 (Preparation of Cerium Oxide Slurry)

125 g of the cerium oxide particles prepared in Preparation 1, 3 g of a 40-wt % aqueous solution of an ammonium salt of a polyacrylic acid copolymer, which was a 3:1—copolymerization product of acrylic acid and methyl acrylate and had an weight average molecular weight of 10,000, and 2372 g of deionized water were mixed, and ultrasonically dispersed with stirring. The dispersing was conducted for 10 minutes with an ultrasonic frequency of 40 kHz. The resulting slurry was filtered through a 0.8-μm filter, and deionized water was added thereto to give a 2-wt % cerium oxide slurry (A-1). The pH of the cerium oxide slurry (A-1) was 8.5. The cerium oxide slurry (A-1) contained particles with an average particle size of as small as 0.20 μm as determined from their particle size distribution measured with a laser diffraction size distribution measuring apparatus. 95.0% of the particles were 1.0 μm or less.

Preparation 4 (Preparation of Cerium Oxide Slurry)

A cerium oxide slurry (A-2) was prepared in the same manner as in Preparation 3, except the cerium oxide particles prepared in Preparation 1 were replaced by the cerium oxide particles prepared in Preparation 2. The pH of the cerium oxide slurry (A-2) was 8.7. The cerium oxide slurry (A-2) contained particles with an average particle size of as small as 0.21 μm as determined from their particle size distribution. 95.0% of the particles were 1.0 μm or less.

Preparation 5 (Preparation of Cerium Oxide Particles)

2 kg of cerium carbonate hydrate was placed in a platinum vessel and burned in the air at 900° C. for 2 hours, to give about 1 kg of yellowish white powder. The powder was identified to be cerium oxide by X-ray diffractiometry. 1 kg of the cerium oxide powder was dry-ground with a jet mill. The cerium oxide particles were monocrystals of 80 to 150 nm in particle size as observed by a transmission electron microscope, and had a specific surface area of 18.5 $m^2/g$ as measured by the BET method.

Preparation 6 (Preparation of Cerium Oxide Slurry)

A cerium oxide slurry (B-1) was prepared in the same manner as in Preparation 1, except the cerium oxide particles prepared in Preparation 1 were replaced by the cerium oxide particles prepared in Preparation 5. The pH of the cerium oxide slurry (B-1) was 8.4. The cerium oxide slurry (B-1) contained particles with an average particle size of as small as 0.35 μm as determined from their particle size distribution. 85.5% of the particles were 1.0 μm or less.

EXAMPLES 1–10 AND COMPARATIVE EXAMPLES 1 AND 2

Cerium oxide slurries and liquid additives were prepared to prepare the CMP abrasives as shown in Table 1, and mixtures of a cerium oxide slurry and a liquid additive were used for polishing an insulating film in the manner described below. The results are listed in Table 1.

The liquid additive used in each of Examples 1–5, 7 and 9 was prepared by dissolving in deionized water a predetermined amount of the same dispersant as that used in the cerium oxide slurry of Example 1.

The dispersant used in Examples 6, 8 and 10 was a polyammonium-acrylate having a weight average molecular weight of 10,000, a number average molecular weight of 8,333, a molecular weight distribution of 1.2 and a content of free ammonium of 4.3 mol %. The liquid additive used in Example 6 had a viscosity of 1.46 mPa·s and a specific gravity of 1.010.

In Comparative Example 2, the same cerium oxide slurry and liquid additive as those used in Example 1 were previously mixed, and the mixture was used for polishing an insulating film one day after.

(Polishing of Insulating Film)

A 125-mm-diameter silicon wafer with a silicon oxide film formed thereon by TEOS-plasma CVD was fixed to a holder to which an attraction pad for fixing substrates was bonded, and was then set, with the surface of the insulating film directed downwardly, on a platen to which a polishing pad made of a porous urethane resin was bonded. A weight was then placed on it to produce a load of 300 $g/cm^2$. The insulating film was polished by rotating the platen at 40 rpm for 2 minutes while feeding a cerium oxide slurry (solid content: 2% by weight) and a liquid additive separately both at a rate of 25 ml/min and dropping them as one liquid onto the platen by controlling nozzles so that they joined together just above the platen. After polishing, the wafer was removed from the holder, washed with running water well, and then with an ultrasonic cleaner for 20 minutes. After washing, water droplets were removed by a spin drier, and the wafer was dried for 10 minutes in a 120° C. drier. The change in the film thickness before and after polishing was measured with a photo-interferent film thickness measuring apparatus to determine the polishing rate.

In place of the silicon oxide film formed by TEOS-plasma CVD, a silicon nitride film produced by low pressure CVD was polished in the same manner under the same conditions, and the change in the film thickness before and after polishing was measured, to determine the polishing rate. The results of the measurements of film thickness show that the silicon oxide film produced by TEOS-plasma CVD and the silicon nitride film produced by low pressure CVD were made uniform in thickness all over the wafers. No flaws were observed on the surfaces of the insulating films by visual observation under a mercury-vapor lamp, but the surfaces were further observed precisely with an apparatus for examining the appearance of wafers (trade name: OLYMPUS Al-2000, produced by Olympus Optical Co., Ltd.).

Similarly, a silicon oxide film having 20-μm-square 5,000-Å-high projections at 100-μm distances was polished, and the degree of dishing was measured at intermediate points between the polished projections to evaluate the flatness.

TABLE 1-1

| | | Example 1 | Example 2 | Example 3 | Example 4 | Example 5 | Example 6 |
|---|---|---|---|---|---|---|---|
| Cerium oxide slurry (500 g) | Name | (A-1) | (A-1) | (A-1) | (A-2) | (A-2) | (A-1) |
| | Primary partical size (nm) | 10–60 Polycrystal | 10–60 Polycrystal | 10–60 Polycrystal | 10–60 Polycrystal | 10–60 Polycrystal | 10–60 Polycrystal |
| | pH | 8.5 | 8.5 | 8.5 | 8.7 | 8.7 | 8.5 |
| Liquid addtive (500 g) | Dispersant | Acrylic acid/ methyl acrylate = 3/1 | Acrylic acid/ methyl acrylate = 3/1 | Acrylic acid/ methyl acrylate = 3/1 | Acrylic acid/ methyl acrylate = 3/1 | Acrylic acid/ methyl acrylate = 3/1 | Acrylic acid/ methyl acrylate = 10/0 |
| | Weight average molecular weight | 10,000 | 10,000 | 10,000 | 10,000 | 10,000 | 10,000 |
| | Conc. (wt %) | 1 | 2 | 6 | 2 | 2 | 3 |
| | pH | 7.3 | 7.5 | 7.7 | 7.5 | 7.5 | 6.8 |
| Plasma-CVD-TEOS-silicon oxide film polishing rate (Å/min) | | 2,000 | 2,000 | 1,500 | 2,000 | 2,000 | 1,800 |
| Low pressure-CVD- | | 40 | 20 | 20 | 20 | 20 | 20 |

TABLE 1-1-continued

|  | Example 1 | Example 2 | Example 3 | Example 4 | Example 5 | Example 6 |
|---|---|---|---|---|---|---|
| silicon nitride film polishing rate (Å/min) |  |  |  |  |  |  |
| Polishing rate ratio (silicon oxide film/silicon nitride film) | 50 | 100 | 75 | 100 | 100 | 90 |
| Flaws on polished oxide film (number/cm$^2$) | 0.05 | 0.05 | 0.05 | 0.05 | 0.05 | 0.05 |
| Degree of dishing (Å) | 150 | 120 | 100 | 130 | 130 | 80 |

TABLE 1-2

| | | Example 7 | Example 8 | Example 9 | Example 10 | Comparative example 1 | Comparative example 2 |
|---|---|---|---|---|---|---|---|
| Cerium oxide slurry (500 g) | Name | (B-1) | (A-1) | (A-1) | (A-1) | (A-1) | (A-1) |
| | Primary partical size (nm) | 80–150 Monocrystal | 10–60 Polycrystal | 10–60 Polycrystal | 10–60 Polycrystal | 10–60 Polycrystal | 10–60 Polycrystal |
| | pH | 8.4 | 8.5 | 8.5 | 8.5 | 8.5 | 8.5 |
| Liquid additive (500 g) | Dispersant | Acrylic acid/methyl acrylate = 3/1 | Acrylic acid/methyl acrylate = 10/0 | Acrylic acid/methyl acrylate = 3/1 | Acrylic acid/methyl acrylate = 10/0 | Deionized water only | Acrylic acid/methyl acrylate = 3/1 |
| | Weight average molecular weight | 10,000 | 10,000 | 10,000 | 10,000 | — | 10,000 |
| | Conc. (wt %) | 2 | 4 | 9 | 6 | — | 1 |
| | pH | 7.5 | 6.5 | 7.9 | 6.0 | 7 | 7.3 |
| Plasma-CVD-TEOS-silicon oxide film polishing rate (Å/min) | | 2,000 | 1,500 | 1,400 | 1,200 | 2,000 | 1,000 |
| Low pressure-CVD-silicon nitride film polishing rate (Å/min) | | 40 | 20 | 20 | 20 | 400 | 50 |
| Polishing rate ratio (silicon oxide film/silicon nitride film) | | 50 | 75 | 70 | 60 | 5 | 20 |
| Flaws on polished oxide film (number/cm$^2$) | | 0.10 | 0.05 | 0.04 | 0.05 | 0.50 | 0.45 |
| Degree of dishing (Å) | | 140 | 70 | 130 | 60 | 850 | 170 |

As apparent from Table 1, the CMP abrasive and method for polishing substrates according to the invention can polish a surface to be polished, such as a silicon oxide film or a silicon nitride film, without contaminating the surface to be polished with alkali metals, such as sodium ions, nor making flaws, and further can increase ratio of (silicon oxide film polishing rate)/(silicon nitride film polishing rate) to 50 or more.

INDUSTRIAL APPLICABILITY

The CMP abrasive of the invention is suitable for polishing methods used in the production of semiconductor elements, particularly for polishing substrates for shallow-trench separation because it can speedily polish a surface to be polished, such as a silicon oxide film, without making flaws.

The CMP abrasive of the invention is as well advantageous in that it does not contaminate the surface to be polished with alkali metals, such as sodium ions, and can increase the ratio of (silicon oxide film polishing rate)/(silicon nitride film polishing rate).

The CMP abrasive of the invention is suitable for polishing methods used in the production of semiconductor elements because it can improve the storage stability of cerium oxide slurries.

The method for polishing substrates of the invention is suitably applicable in the production of semiconductor elements because it excels in polishing speedily a surface to be polished, such as silicon oxide film, without making flaws.

The invention claimed is:

1. A liquid additive for CMP abrasive consisting essentially of a dispersant and water, wherein the dispersant is one of a polyammonium-acrylate or a polyamine-acrylate and has a weight average molecular weight of 1,000 to 100,000, and wherein the liquid additive contains 1 to 10% by weight of the dispersant.

2. The liquid additive for CMP abrasive of claim 1, wherein the dispersant has a weight average molecular weight of 10,000 to 40,000.

3. A liquid additive for CMP abrasive consisting essentially of a dispersant and water, wherein the dispersant is a polymer dispersant, wherein said polymer dispersant is a polymer containing ammonium acrylate as a copolymerized ingredient, a polyammonium-acrylate or a polyamine-acrylate and has a weight average molecular weight of 1,000 to 100,000, and wherein the liquid additive contains 1 to 10% by weight of the dispersant and is pH 4 to 8.

4. The liquid additive for CMP abrasive of claim 3, wherein the dispersant is one of a polyammonium-acrylate or a polyamine-acrylate.

5. A liquid additive for CMP abrasive consisting essentially of a dispersant and water, wherein the dispersant is one of a polyammonium-acrylate or a polyamine-acrylate and has a molecular weight distribution (weight average molecular weight/number average molecular weight) of 1.005 to 1.300, and wherein the liquid additive contains 1 to 10% by weight of the dispersant and is pH 4 to 8.

6. A liquid additive for CMP abrasive consisting essentially of a dispersant and water, wherein the dispersant is one of a polyammonium-acrylate or a polyamine-acrylate and contains 10 mol % or less of free ammonia or a free amine, which does not form a salt, and wherein the liquid contains 1 to 10% by weight of the dispersant and is pH 4 to 8.

7. A liquid additive for CMP abrasive consisting essentially of a dispersant and water, wherein the dispersant is one of a polyammonium-acrylate or a polyamine-acrylate, and wherein the liquid additive contains 1 to 10% by weight of the dispersant, is pH 4 to 8 and has a viscosity of 1.20 to 2.50 mPa·s.

8. A liquid additive for CMP abrasive consisting essentially of a dispersant and water, wherein the dispersant is a polymer dispersant, wherein said polymer dispersant is a polymer containing ammonium acrylate as a copolymerized ingredient, a polyammonium-acrylate or a polyamine-acrylate, and has a weight average molecular weight of 10,000 to 40,000, and wherein the liquid additive contains 1 to 10% by weight of the dispersant and is pH 4 to 8.

9. The liquid additive for CMP abrasive of claim 8, wherein the dispersant is one of a polyammonium-acrylate or a polyamine-acrylate.

* * * * *